(12) United States Patent
Baba et al.

(10) Patent No.: US 6,718,829 B2
(45) Date of Patent: Apr. 13, 2004

(54) SEMICONDUCTOR PRESSURE SENSOR AND AN EXHAUST SYSTEM INCLUDING THE SAME

(75) Inventors: Hironobu Baba, Oobu (JP); Kazuyoshi Nagase, Aichi-ken (JP); Yukihiro Kato, Kariya (JP)

(73) Assignee: Denso Corporation, Kariya (JP)

( * ) Notice: Subject to any disclaimer, the term of this patent is extended or adjusted under 35 U.S.C. 154(b) by 123 days.

(21) Appl. No.: 10/072,956

(22) Filed: Feb. 12, 2002

(65) Prior Publication Data

US 2002/0112610 A1 Aug. 22, 2002

(30) Foreign Application Priority Data

Feb. 19, 2001 (JP) ........................ 2001-042068

(51) Int. Cl.7 .................................. G01L 9/00
(52) U.S. Cl. .................. 73/754; 73/721; 73/727; 73/726; 73/734
(58) Field of Search ................. 73/700, 721, 727, 73/725, 726, 734, 754

(56) References Cited

U.S. PATENT DOCUMENTS 5,249,468 A * 10/1993 Benedikt et al. ............. 73/706
5,606,117 A * 2/1997 Vogel et al. ................. 73/115
5,789,797 A    8/1998 Ikuta et al.
6,422,088 B1 * 7/2002 Oba et al. .................. 73/754

FOREIGN PATENT DOCUMENTS

| JP | 51-106475  | 9/1976  |
| JP | 61-201866  | 9/1986  |
| JP | 62-175631  | 8/1987  |
| JP | 62-160342  | 10/1987 |
| JP | 4-241761   | 8/1992  |
| JP | 9-45855    | 2/1997  |

* cited by examiner

*Primary Examiner*—Edward Lefkowitz
*Assistant Examiner*—Andre Allen
(74) *Attorney, Agent, or Firm*—Posz & Bethards, PLC

(57) ABSTRACT

The full bridge circuit in a pressure sensor including semiconductor piezoelectric resistive elements in a pressure detection structure is connected to a filter. That is, first and second output terminals of the full bridge circuit is connected to a capacitor. One end of the capacitor is connected to the first output terminal through a first resistor. The other end of the capacitor is connected to the second output terminal through a second resistor. In an exhaust system of an engine, the pressure of the exhaust gas is detected to detect clogging in the black smoke removing unit. The filter removes the pulsate component in the detection signal derived from the pulsate component in the exhaust gas.

1 Claim, 5 Drawing Sheets

SEMICONDUCTOR PRESSURE SENSOR AND AN EXHAUST SYSTEM INCLUDING THE SAME

BACKGROUND OF THE INVENTION

1. Field of the Invention

This invention relates to a semiconductor pressure sensor for detecting a pressure and an exhaust system including the same.

2. Description of the Prior Art

In an exhaust system for a diesel engine, a particulate component removing device called as a diesel particulate filter (DPF) is used for removing particulate component in the exhaust gas from the diesel engine.

FIG. 4 shows such a prior art exhaust system. The DPF 120 is provided at an intermediate portion of an exhaust tube 122 between an engine 121 and a muffler to catch black smoke particulate components in the exhaust gas from the engine through an exhaust manifold 123 to prevent the black smoke from being exhausted from the muffler.

During the operation of the DPF 120, black smoke components accumulate at the filter in the DPF 120. Thus, the accumulated black smoke components clog the filter. The accumulated black smoke components are periodically burned with a heater for cleaning for example.

The clogging of the filter is detected based on the pressure difference between the front and the rear of the filter or the pressure difference between the front of the filter and the atmospheric pressure. In this prior art, a semiconductor pressure sensor 124 is provided between the DPF 120 and the engine 121 to detect the pressure at the front of the filter.

However, the detection signal from the semiconductor pressure sensor 124 includes a pulsate exhaust pressure component as shown in FIG. 5.

The semiconductor pressure sensor 124 has a pressure response of several milliseconds. On the other hand, the exhaust gas pressure pulsates at a cycle of about 15 ms. Accordingly, the detection signal of the semiconductor pressure sensor 124 includes the pulsate exhaust gas component.

The curve shown in FIG. 5 represents the pressure pulsation of the exhaust gas in the case that a motor vehicle with a diesel turbo engine having a piston displacement of 3000 cc with intercooler travels on a slope.

Here, if it is assumed that the detection range of the semiconductor pressure sensor 124 is determined to include the peak to peak of the pulsation, the detection range would become large because the pressure variation due to clogging of the filter to be detected is about 5 kPa but the peak to peak of the pulsation is about 40 kPa. Accordingly, the resolution of the semiconductor pressure sensor 24 is reduced. This decreases the accuracy in detection pressure variation due to the clogging. Thus, the pulsating component should be removed from the detection signal of the semiconductor pressure sensor 124.

FIGS. 6A and 6B show prior art pulsation component removing structures. In FIG. 6A, a capacitive portion is provided in the tube 125 for introducing the pressure to the semiconductor pressure sensor 124, wherein the capacitive portion 126 has a larger diameter than the tube 125. On the other hand, in FIG. 6B, a recess portion 127 is provided in the tube 125 for introducing the pressure to the semiconductor pressure sensor 124, wherein the recess portion 127 has a smaller diameter than the tube 125. These structures retards pressure propagation to the semiconductor pressure sensor 124 to remove the pulsating components.

However, standardization of these structures are difficult because the optimum forms of the capacitive portion 126 and the recess portion 127 are dependent on every form of the tube 125.

On the other hand, Japanese utility model application provisional publication No. 62-160342 discloses a full bridge circuit with a low pass filter. FIG. 7 shows this prior art full bridge circuit in a pressure sensor including semiconductor piezoelectric resistive elements R101, R102, R103, and R104. Input terminals A0 and B0 of this full bridge circuit are connected to a voltage supply 32. The output terminals C0 and D0 are connected to a non-inverting input and an inverting input of an operational amplifier 31, respectively.

When a pressure is applied to this semiconductor pressure sensor, resistances of the semiconductor piezoelectric resistive elements R101 to R104 vary. This generates a voltage difference between the output terminals C0 and D0 which are connected to one ends of capacitors C10 and C20, respectively. The other ends of the capacitors C10 and C20 are connected to the ground.

Therefore, the capacitors C10 and C20 and semiconductor piezoelectric resistive elements R101, R102, R103, and R104 form low pass filters.

These low pass filters retard the response in the full bridge circuit. Thus, this full bridge circuit in the pressure sensor 124 can remove the pulsate components.

This full bridge circuit has two capacitors having a relatively large capacitances, so that the chip size including the semiconductor pressure sensor becomes relatively large.

SUMMARY OF THE INVENTION

The aim of the present invention is to provide a superior semiconductor pressure sensor and a superior exhaust system including the semiconductor pressure sensor.

According to the present invention, a first aspect of the present invention provides a semiconductor pressure sensor comprising:

a full-bridge circuit including semiconductor sensitive elements in a pressure sensitive structure and first and second output terminals; and a filter for filtering output signals from said first and second output terminals, said filter including:
first and second resistors; and
a capacitor, one end of said capacitor being connected to said first output terminal through said first resistor, the other end of said capacitor being connected to said second output terminal through said second resistor.

According to the present invention, a second aspect of the present invention provides an exhaust system for motor vehicle comprising:

an engine;

particulate component removing means for removing particulate components in an exhaust gas from said engine; and a semiconductor pressure sensor provided between said engine and said particulate component removing means for detecting a pressure of an exhaust gas from said engine before said particulate component removing means, comprising:

a full-bridge circuit including semiconductor sensitive elements in a pressure sensitive structure for receiving said pressure and first and second output terminals; and a filter for filtering output signals from said first and second output terminals, said filter including:

first and second resistors; and a capacitor, one end of said capacitor being connected to said first output terminal through said first resistor, the other end of said capacitor being connected to said second output terminal through said second resistor.

According to the present invention, a third aspect of the present invention provides the exhaust system based on the second aspect, wherein said filter removes a pulsating component in said exhaust gas from said engine.

According to the present invention, a fourth aspect of the present invention provides the exhaust system based on the second aspect, wherein a time constant of said filter is determined in accordance with a pulsating frequency of said exhaust gas from said engine.

BRIEF DESCRIPTION OF THE DRAWINGS

The object and features of the present invention will become more readily apparent from the following detailed description taken in conjunction with the accompanying drawings in which.

The same or corresponding elements or parts are designated with like references throughout the drawings.

DETAILED DESCRIPTION OF THE INVENTION

The semiconductor pressure sensor according to this invention is used for detecting clogging in the diesel particulate filter (DPF) for diesel engine motor vehicle for example.

Figure 1:
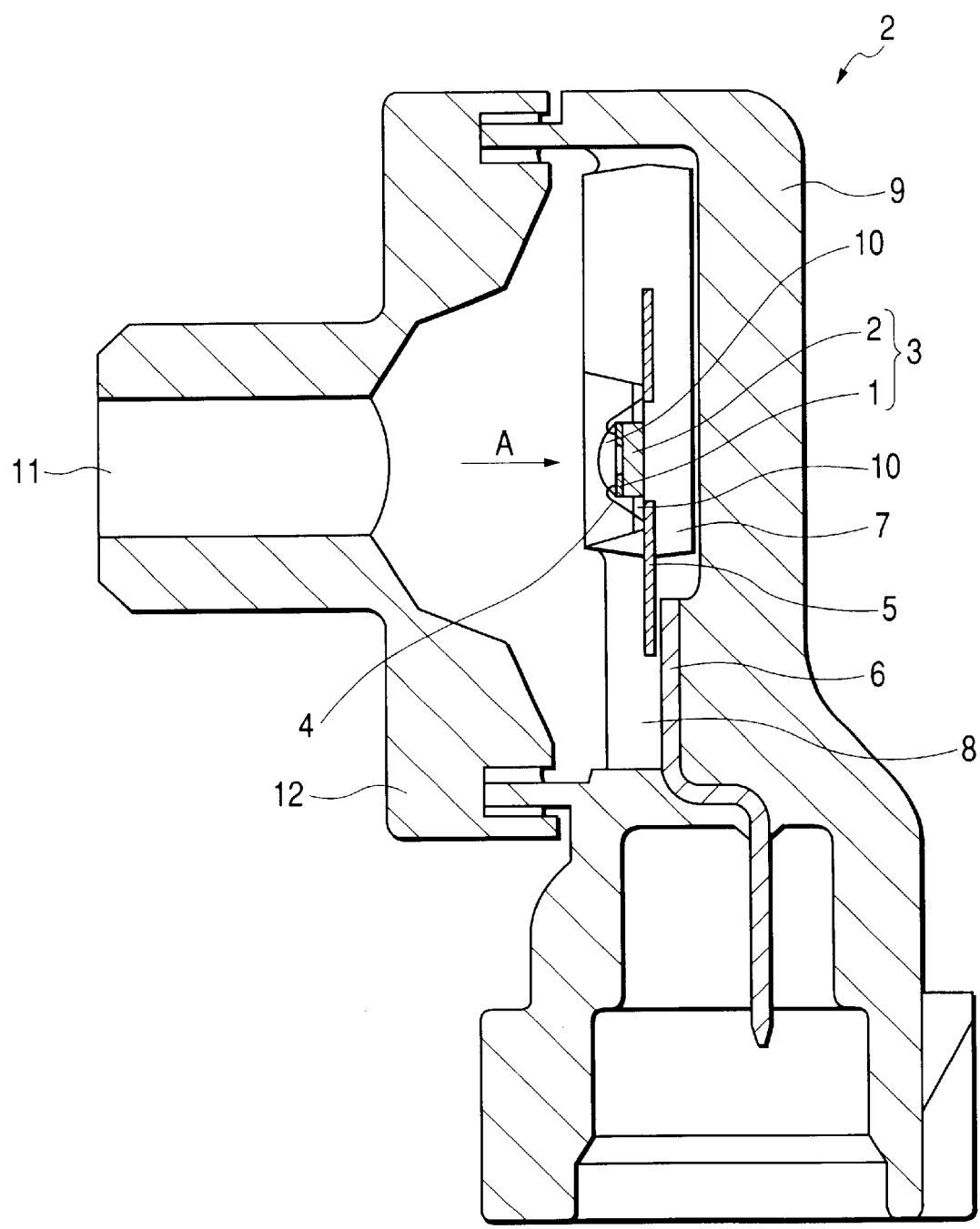
FIG. 1 is a sectional view of the semiconductor pressure sensor according to this embodiment.
Figure 2:
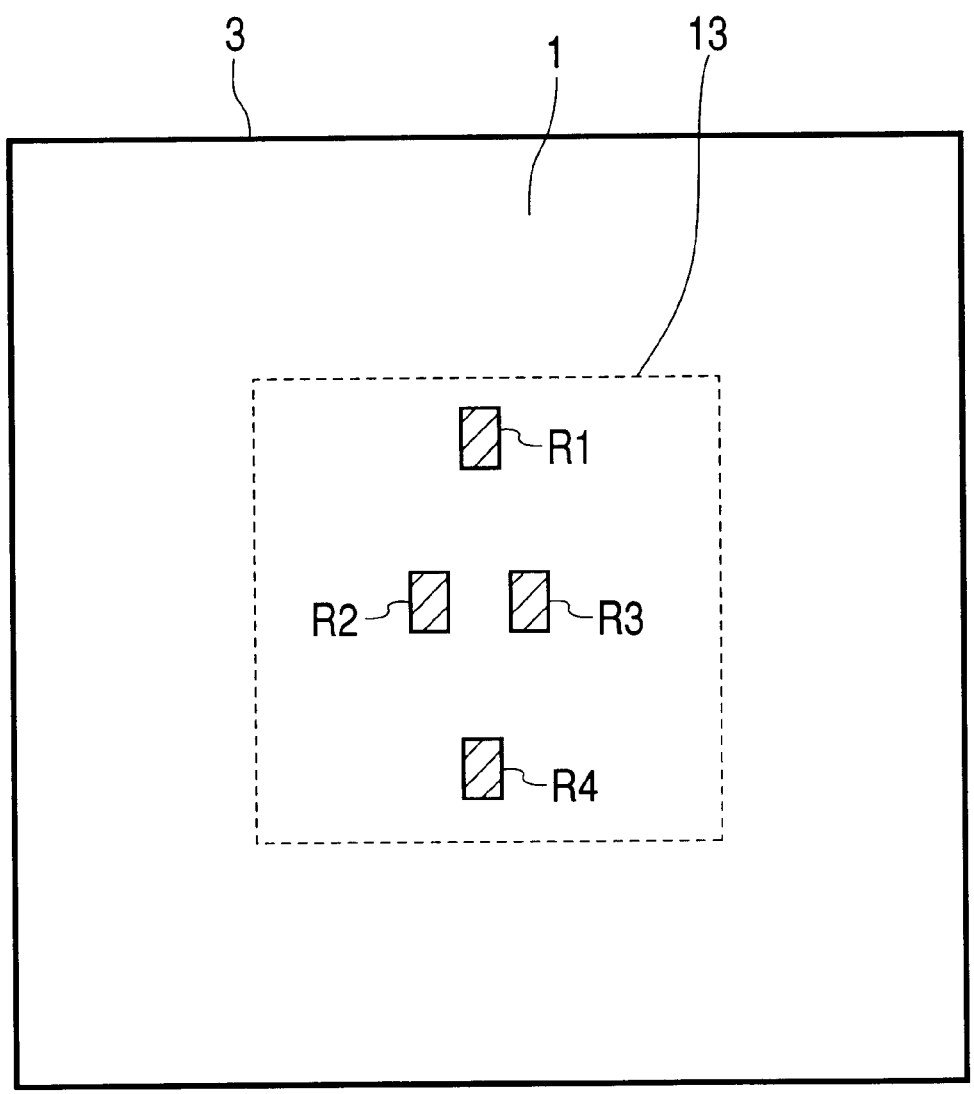
FIG. 2 is an enlarged partial side view of the pressure detection portion of the semiconductor pressure sensor viewed in direction A shown in FIG. 1.
Figure 3A:
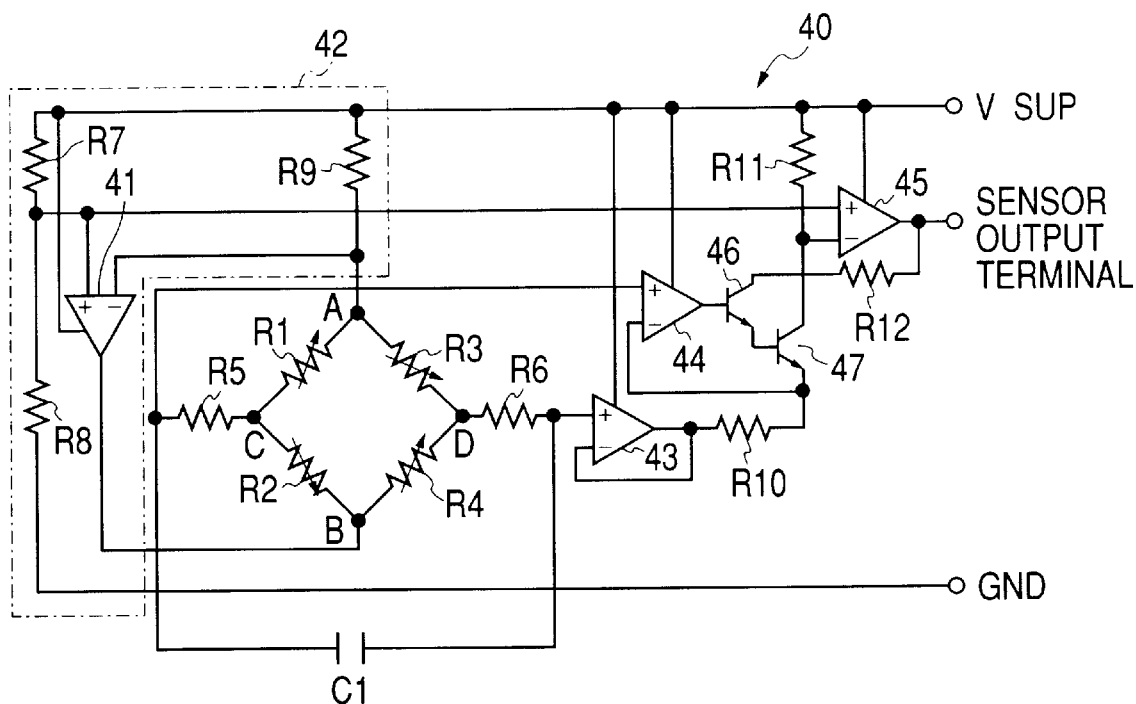
FIG. 3A is an equivalent circuit diagram of the bridge circuit and a processing circuit according to this embodiment.

FIG. 1 is a sectional view of the semiconductor pressure sensor according to this embodiment. FIG. 2 is an enlarged partial side view of the pressure detection portion of the semiconductor pressure sensor viewed in a direction A shown in FIG. 1. FIG. 3A is an equivalent circuit diagram of the semiconductor pressure sensor 40 including the bridge circuit and a processing circuit formed on the surface of the pressure detection portion 3.

Referring now to FIG. 1, the semiconductor pressure sensor according to this embodiment includes a sensor chip 1 and a glass base 2 which form the pressure detection portion 3 having a rectangular section. The pressure detection portion 3 has the processing circuit for converting the detected pressure into an electric detection signal through a predetermined function.

The pressure detection portion 3 is electrically connected to connector pins 6 through wires 4 and leads 5. Thus, the electric detection signal converted by the pressure detection portion 3 can be supplied to an external circuit through the connector pins 6.

Moreover, the pressure detection portion 3 is adhered to a hollow portion in a molded plastic member 7 with an adhesive of Fluorosilicone type. The molded plastic member 7 is adhered to a case 9 with a Fluorine rubber 8 and as well as covered with the Fluorine rubber 8.

The pressure detection portion 3 and the wires 4 are coated with Parylene to be electrically insulated and further covered with gel 10 which is infused into the hollow portion of the molded plastic member 7 to protect them from contamination substances such as misty engine oil or carbon.

The pressure detection portion 3 is covered in a port 12 having a dome shape with a pressure introducing hole 11 to provide air tightness and to introduce the pressure to be detected. The port 12 is adhered to the case 9 with an epoxide resin adhesive.

The port 12 has a stepwise conical inside wall of which section in the radial direction expands toward the pressure detection portion 3. In other words, a conical space is provided between the port 12 and the detection portion 3.

Referring now to FIG. 2, the pressure detection portion 3 has a silicon chip 1 on the glass base 2. At the center of the sensor chip 1, a diaphragm 13 is formed by anisotropic etching.

At the surface of the sensor chip 1, the semiconductor piezoelectric resistive elements R1, R2, R3, and R4 are formed by doping with a P type of impurity such as boron in the silicon chip (substrate) 1 by ion injection. Moreover, the semiconductor piezoelectric resistive elements R1, R2, R3, and R4 and wiring patterns (not shown in FIG. 2) such as diffused impurity patterns and aluminium patterns form a full bridge.

When a pressure is applied to the diaphragm 13, the diaphragm 13 is elastically deformed, that is, bent. Then, the resistances of the semiconductor piezoelectric resistive elements R1, R2, R3, and R4 vary in accordance with the magnitude of the pressure.

Moreover, at the edge of the sensor chip 1, a pad portion (not shown in FIG. 2) is formed to output the electric detection signal and receive a supply voltage and to provide connection to the ground.

Refereeing now to FIG. 3A, the semiconductor pressure sensor 40 has the full bridge circuit with the semiconductor piezoelectric resistive elements R1, R2, R3, and R4. With increase in the pressure, resistances of a pair of semiconductor piezoelectric resistive elements R1 and R4 arranged at the confronting sides in the quadrangle of the full bridge in the equivalent circuit diagram increases. On the other hand, with increase in the pressure, resistances of a pair of semiconductor piezoelectric resistive elements R2 and R3 arranged at the confronting sides in the quadrangle of the full bridge in the equivalent circuit diagram decreases.

The full bridge circuit is supplied with a constant current from a constant current source including resistors R7, R8, and R9 and an operational amplifier 41.

More specifically, the current determined by dividing a voltage difference between the supply voltage and a reference voltage which is obtained by dividing the supply voltage with resistors R7 and R8, is supplied to the terminal A (junction point between the semiconductor piezoelectric resistive elements R1 and R3).

When supplied with the constant current, the full bridge circuit outputs voltages V1 and V2 of which magnitudes are depended on the magnitude of the applied pressure.

The output voltages V1 and V2 are processed with a differential amplifying circuit including operational amplifiers 43, 44, and 45, and transistors 46, 47, and resistors R10, R11, and R12.

More specifically, the non-inverting input of the operational amplifier 44 is supplied through a resistor R5 with the voltage V1 from the terminal C between the semiconductor piezoelectric resistive elements R1 and R2 which are neighbor with each other in the full bridge circuit. The inverting input of the operational amplifier 44 is supplied with the voltage V2 from the terminal D (junction point between the semiconductor piezoelectric resistive elements R3 and R4 which are neighbor with each other) through the resistor R6, the operational amplifier 43 functioning as a buffer, and the resistor R10. Thus, the amplified difference between the voltage V1 and V2 is outputted by the operational amplifier 44.

The output from the operational amplifier 44 controls the transistors 46 and 47.

This operation converts the bridge circuit output voltage (V1–V2) into a current which is further amplified by the operational amplifier 45. The output of the operational amplifier 45 is outputted as the electric detection signal at the sensor output terminal.

According to this embodiment, one end of a capacitor C1 is connected to the junction point C through the resistor R5, and the other end of the capacitor C1 is connected to the junction point D through the resistor R6.

As a result, the resistors R5 and R6, and the capacitor C1 form a low pass filter which retards the response of the voltage V1 and V2. This removes the pulsate component in the voltages V1 and V2.

Moreover, this structure reduces the number and the capacity of the capacitors used in the pressure sensor.

More specifically, for example, if a motor vehicle with a four-cylinder engine is driven at 5000 rpm, the cycle of the pulsate component is given by:

$$60[s]/500[rpm]/2=0.24[s]$$

Figure 7:
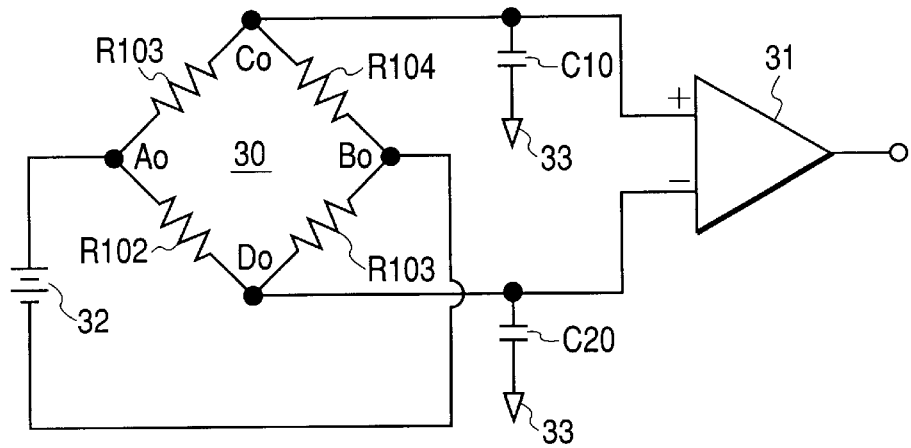
FIG. 7 is a schematic circuit diagram of a prior art full bridge circuit.

Here, comparison between this invention and the prior art shown in FIG. 7 is made.

If it is assumed that resistances of the semiconductor piezoelectric resistive elements R101 to R104 in the prior art shown in FIG. 7 are 15 kΩ.

The capacitances of the capacitor C10 and C20 were given by:

$$0.24[s]/15[k\Omega]=20[\mu F]$$

On the other hand, the circuit structure of the semiconductor pressure sensor according to this embodiment has the capacitor C1 of which ends are connected to the junction points C and D through the resistor R5 and R6, respectively. Then, the imaginal middle point between the junction points C and D can be considered as a fixed voltage point. Accordingly, the low pass filter in the equivalent circuit diagram shown in FIG. 3A can be converted into another equivalent circuit diagram shown in FIG. 3B.

Figure 3B:
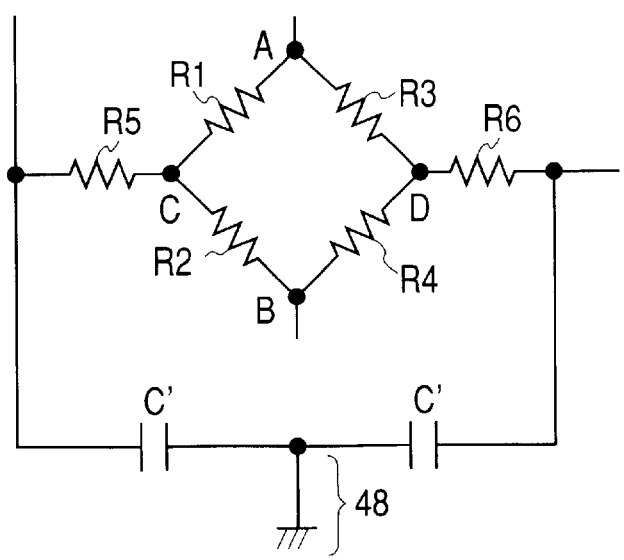
FIG. 3B is a partial equivalent circuit diagram of the bridge circuit and a filter according to this embodiment.
Figure 4:
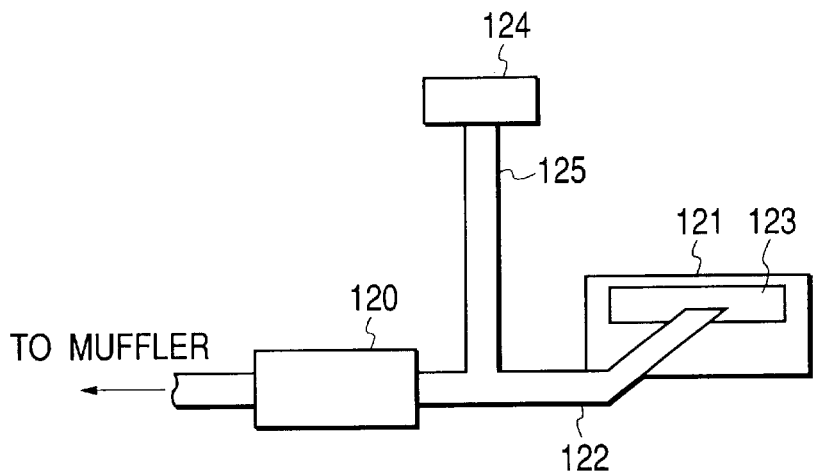
FIG. 4 is an illustration of a prior art exhaust system.
Figure 5:
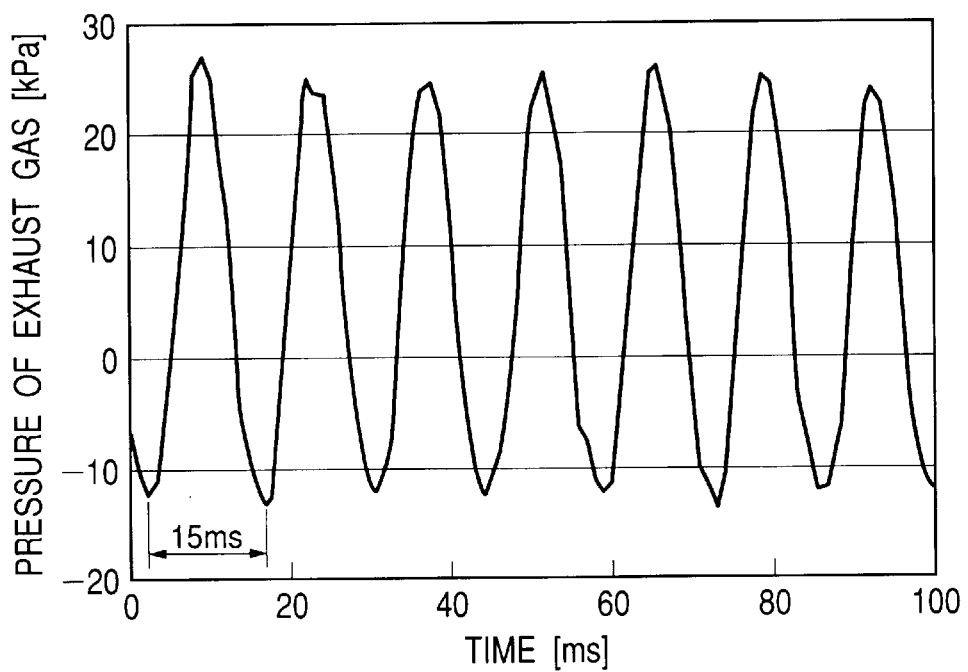
FIG. 5 is a graphical drawing of a pulsating components in the exhaust gas in the prior art.
Figure 6A:
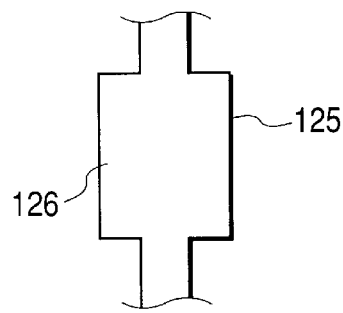
FIGS. 6A and 6B are illustrations of prior art filter structures.
Figure 6B:
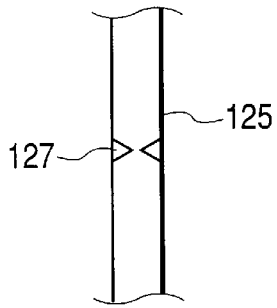

In FIG. 3B, the capacitor C1 is divided into two capacitors C', and an imaginal ground 48 is shown between the capacitors C'.

If it is assumed that resistances of the semiconductor piezoelectric resistive elements R1 to R4 and the resistors R5 and R6 in this embodiment are 15 kΩ, the capacitance of the capacitor C1 is given by:

$$0.24[s]/15[k\Omega]/2=10[\mu F]$$

That is, because the capacitor C1 corresponds to the two capacitors C' connected in series, so that the capacitance of the capacitor C1 is a half of that of the capacitor C10 or C20 (20 μF) in the prior art, that is 10 μF.

Thus, according to this embodiment, the number of the capacitors can be reduced from two to one, and the capacitance of the capacitor C1 can be made half.

The above-mentioned embodiment may be modified. For example, in this embodiment the resistances of the resistors R5 and R6 are assumed to be 15 kΩ and the capacitance of the capacitor C1 is assumed to be 10 μF. However, these values can be modified.

Moreover, in this embodiment the number of the semiconductor piezoelectric resistive element in one side of the bridge circuit is one. However, such a semiconductor piezoelectric resistive element at one side of the bridge circuit may be divided into two or more.

Figure 8:
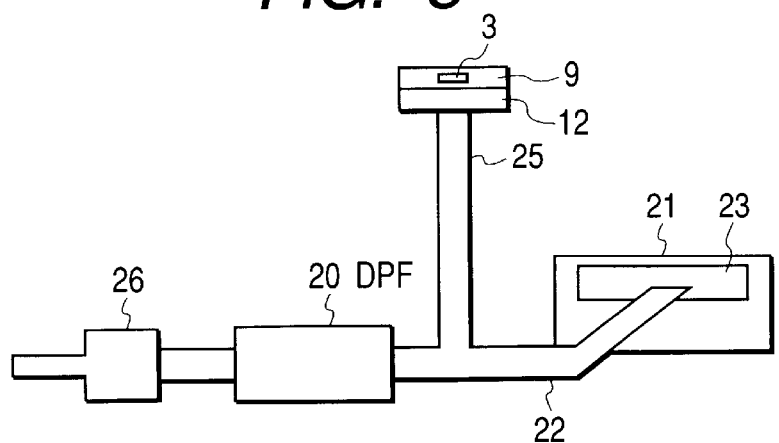
FIG. 8 is an illustration of the exhaust system according to this invention.

FIG. 8 is an illustration of an exhaust system for a diesel engine according to this invention. A particulate component removing device called as diesel particulate filter (DPF) 20 for removing particulate component in the exhaust gas from the diesel engine is used.

In FIG. 8, a particulate component removing device known as a diesel particulate filter (DPF) 20 is provided at an intermediate portion of an exhaust tube 22, that is, arranged between an engine 21 and a muffler 26 to catch black smoke particulate components in the exhaust gas from the engine 21 though an exhaust manifold 23 to prevent the black smoke from being exhausted from the muffler 26.

During the operation of the DPF 20, black smoke components accumulate at the filter in the DPF 20. Thus, the accumulated black smoke components clog the filter. The accumulated black smoke components are periodically burned with a heater in the DPF20 for cleaning for example.

The clogging of the filter is detected based on the pressure difference between the front of the filter and the atmospheric pressure by the semiconductor pressure sensor 40 arranged between the DPF 20 and the engine 21 to detect the pressure at the front of the filter. More specifically, at an intermediate portion of the exhaust tube 22 is divided into two. One is connected to the muffler 26 and the other is connected to the sensor assembly 2 including the reassure sensor 40 through a tube 25.

The time constant of the filter including the resistors R5 and R6 and the capacitance of the capacitor C1 is determined in accordance with pulsation frequency of the exhaust gas from the diesel engine 21 to suppress the pulsation component detected by the pressure sensor. Moreover, the time constant of the filter including the resistors R5 and R6 and the capacitance of the capacitor C1 may be determined in accordance with an engine speed of the diesel engine 21.

What is claimed is:

1. A semiconductor pressure sensor comprising:
   a full-bridge circuit including semiconductor sensitive elements in a pressure sensitive structure and first and second output terminals; and
   a filter for filtering output signals from said first and second output terminals, said filter including:
      first and second resistors; and
      a capacitor, one end of said capacitor being connected to said first output terminal through said first resistor, the other end of said capacitor being connected to said second output terminal through said second resistor.

* * * * *